United States Patent
Eng et al.

(10) Patent No.: US 7,221,907 B2
(45) Date of Patent: May 22, 2007

(54) ON ORBIT VARIABLE POWER HIGH POWER AMPLIFIERS FOR A SATELLITE COMMUNICATIONS SYSTEM

(75) Inventors: John E. Eng, Buena Park, CA (US);
Donald J. Mirrione, Gilbert, AZ (US);
Dale H. Claxton, Encino, CA (US);
Kuei-Ru Chien, Cerritos, CA (US);
Brian J. Behler, Lomita, CA (US);
James Lee, Monterey Park, CA (US)

(73) Assignee: The Boeing Company, Chicago, IL (US)

( * ) Notice: Subject to any disclaimer, the term of this patent is extended or adjusted under 35 U.S.C. 154(b) by 405 days.

(21) Appl. No.: 10/365,359

(22) Filed: Feb. 12, 2003

(65) Prior Publication Data

US 2004/0157552 A1  Aug. 12, 2004

(51) Int. Cl.
*H04B 7/185* (2006.01)

(52) U.S. Cl. .................. 455/12.1; 455/13.2; 455/13.3; 455/13.4; 370/318

(58) Field of Classification Search ............... 455/12.1, 455/10, 13.2–13.4, 24, 427, 430; 370/316, 370/318
See application file for complete search history.

(56) References Cited

U.S. PATENT DOCUMENTS

| | | | | |
|---|---|---|---|---|
| 4,160,288 A | * | 7/1979 | Stuart et al. .................. 363/41 |
| 4,564,816 A | * | 1/1986 | Kumar et al. ................ 330/149 |
| 4,941,199 A | * | 7/1990 | Saam ........................... 455/10 |
| 6,035,181 A | * | 3/2000 | Gross ....................... 455/127.2 |
| 6,212,360 B1 | * | 4/2001 | Fleming et al. ............. 455/13.4 |
| 6,456,824 B1 | * | 9/2002 | Butte et al. ................ 455/12.1 |
| 6,799,014 B2 | * | 9/2004 | Rosen et al. ............... 455/12.1 |
| 6,856,284 B1 | * | 2/2005 | Cangiani ..................... 342/372 |
| 2002/0067310 A1 | * | 6/2002 | Pietrusiak ................... 342/368 |
| 2002/0098803 A1 | * | 7/2002 | Poulton et al. ............ 455/13.1 |
| 2002/0164950 A1 | * | 11/2002 | Chu et al. .................. 455/13.4 |
| 2003/0134595 A1 | * | 7/2003 | DiCamillo et al. ........ 455/13.4 |
| 2004/0198218 A1 | * | 10/2004 | Linsky et al. .............. 455/13.2 |

* cited by examiner

*Primary Examiner*—Matthew Anderson
*Assistant Examiner*—Sujatha Sharma
(74) *Attorney, Agent, or Firm*—Ostrager Chong Flaherty & Broitman P.C.

(57) ABSTRACT

A power system for a satellite includes a high power amplifier that has a control input. The high power amplifier has a minimum effective isotropic radiated power. A controller is coupled to the control input. The controller generates a control signal to adjust a saturated power output of the high power amplifier to the minimum effective isotropic radiated power.

19 Claims, 3 Drawing Sheets

| dB OBO | DC Input Power With RF Input Power Back Off | | | DC Input Power With Variable Power Control | | | |
|---|---|---|---|---|---|---|---|
| | TTE TWT | EDD TWT | SSPA | TTE TWT | Savings | SSPA | Savings |
| 0 | 100.0W | 100.0W | 100.00W | 100.0W | 0.0W | 100.0W | 0.0W |
| 0.2 | 97.0W | 98.5W | 98.0W | 95.6W | 1.4W | 95.6W | 2.4W |
| 0.5 | 94.0W | 96.5W | 95.0W | 89.5W | 4.5W | 89.3W | 5.7W |
| 1 | 89.0W | 93.0W | 91.0W | 80.0W | 9.0W | 79.7W | 11.3W |
| 1.5 | 84.0W | 88.0W | 87.0W | 71.7W | 12.3W | 71.2W | 15.8W |
| 2 | 81.0W | 85.0W | 84.0W | 64.2W | 16.8W | 63.6W | 20.4W |
| 2.5 | 78.0W | 82.0W | 82.0W | 57.5W | 20.5W | 56.9W | 25.1W |
| 3 | 74.0W | 79.0W | 80.0W | 51.6W | 22.4W | 50.9W | 29.1W |

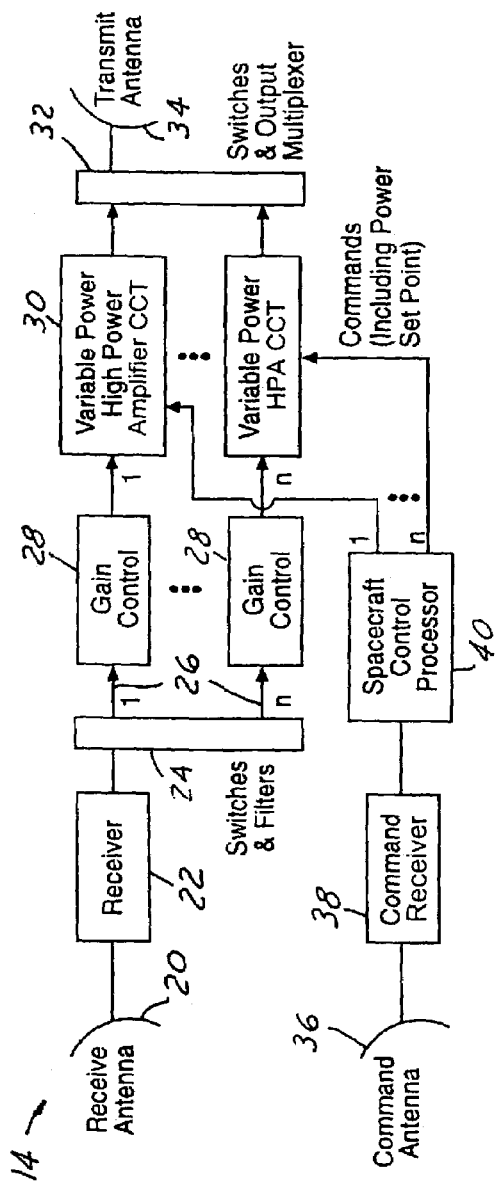
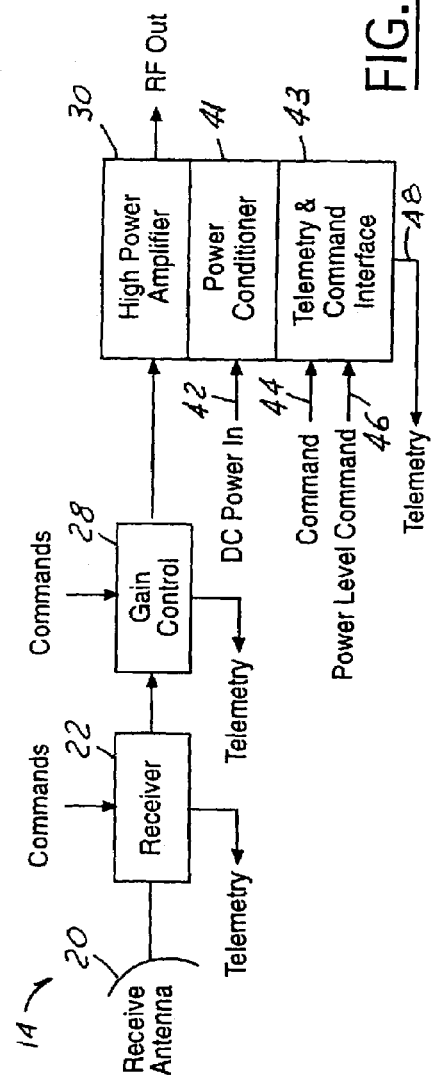

ON ORBIT VARIABLE POWER HIGH POWER AMPLIFIERS FOR A SATELLITE COMMUNICATIONS SYSTEM

TECHNICAL FIELD

The present invention relates generally to communication satellites, and more particularly, to a power control system for such satellites.

BACKGROUND ART

Communication satellites use high power amplifiers that are used to increase the power of received signals. Typically, communication satellites have high power amplifiers that are grouped together in redundancy rings. Each high power amplifier within the ring has the same operating frequency, bandwidth, and output power. For example, on one of Boeing's commercial satellites, there are forty 32 Ku-Band 120 W traveling wave tube amplifiers, 24 C-Band 40 W traveling wave tube amplifiers, and 38 90 W Ka-Band traveling wave tube amplifiers. Each high power amplifier must be able to meet the effective isotropic radiated power (EIRP) requirements of the adjacent high power amplifiers within the redundancy ring. However, not all of the high power amplifiers have the identical EIRP requirements. Therefore, extra power is provided to high power amplifiers that have lower EIRP requirements. This is not very power efficient. Reducing the amount of power consumed by a satellite is a goal for satellite producers. Reducing the amount of power consumed by the various components allows additional transponders to be placed upon the satellite to generate additional revenue or allows the power system of the satellite to be reduced.

It would therefore be desirable to reduce the amount of power consumed by high power amplifier circuit systems.

SUMMARY OF THE INVENTION

The present invention reduces the amount of power consumed by the high power amplifier circuitry by controlling the saturation power of the high power amplifier.

In one aspect of the invention, a power system for a satellite includes a high power amplifier that has a control input. The high power amplifier has a minimum effective isotropic radiated power. A controller is coupled to the control input. The controller generates a control signal to adjust a saturated power output of the high power amplifier to the minimum effective isotropic radiated power.

In a further aspect of the invention, a method for operating a satellite includes providing a plurality of high power amplifiers, each power amplifier having a minimum effective isotropic radiated power, generating a control input for a plurality of high power amplifiers, adjusting the effective saturated power output of the plurality of high power amplifiers to the minimum effective isotropic radiated power.

One advantage of the invention is that by reducing the amount of power consumed in the high power amplifiers, the overall size of the power subsystem may be reduced or additional revenue generating transponders may be deployed on the satellite.

Another advantage of the invention is that by reducing the saturated output power point, more DC power reduction is provided than merely backing off the drive power to the high power amplifiers.

Other aspects and advantages of the present invention will become apparent upon the following detailed description and appended claims, and upon reference to the accompanying drawings.

BRIEF DESCRIPTION OF THE DRAWINGS

FIG. 2 is a simplified block diagrammatic view of a satellite with a number of variable power transponders.

FIG. 3 is a detailed block diagrammatic view of a high power amplifier circuit of FIG. 2.

BEST MODES FOR CARRYING OUT THE INVENTION

Figures 1, 4:
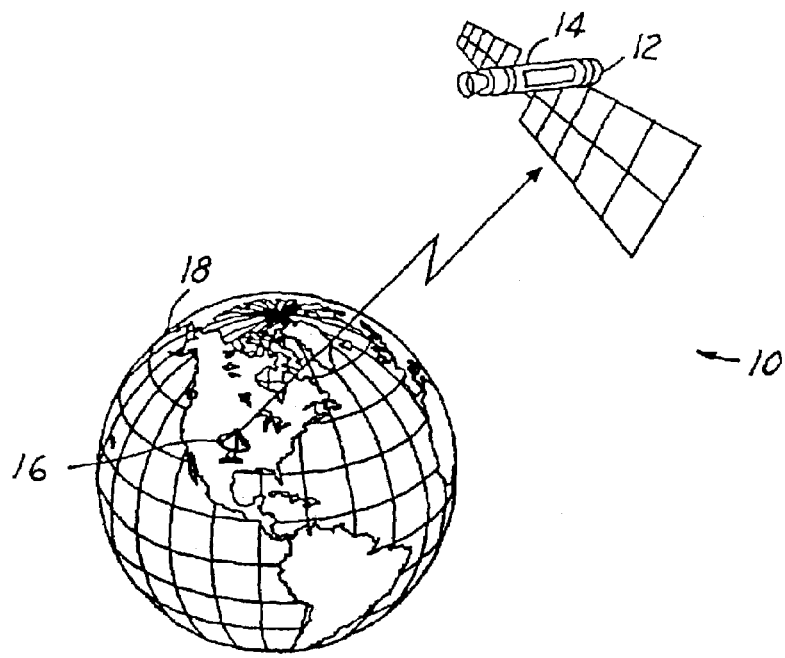
FIG. 1 is an elevational view of a satellite communicating with a ground station according to the present invention.
FIG. 4 is a chart illustrating the amount of power savings of the present invention.

In the following figures the same reference numerals will be used to identify the same components.

It should be understood that the present invention is applicable to various types of high power amplifiers as well as various numbers of high power amplifiers. Also, the present invention may be employed in groups or rings of high power amplifiers.

Referring now to FIG. 1, a satellite communication system 10 is illustrated having a satellite 12 having a communication system 14 therein. The communication system 14 communicates with a ground station 16 on earth 18.

Referring now to FIG. 2, communication system 14 is illustrated in further detail. A receive antenna 20 is coupled to a receiver 22. Receiver 22 is coupled to switches and filters 24 that process the signals in a conventional manner. The switches and filters divide the signals into various signal paths 26. Each of the signal paths has a gain control 28. Each gain control controls the gain in a corresponding variable power high power amplifier circuit 30. Each high power amplifier circuit generates a signal, each of which are coupled to switches and output multiplexer 32 which in turn is coupled to a transmit antenna 34.

High power amplifier 30 may be one of various types of high power amplifiers including a traveling wave tube amplifier or a solid-state power amplifier.

The communication system also has a command antenna 36. The command antenna receives command signals from ground station 16 shown in FIG. 1. Command antenna 36 is coupled to a command receiver 38, and ultimately to a spacecraft control processor or controller 40. Spacecraft control processor 40 may be coupled to many things, including the variable power high power amplifier circuits 30.

Referring now to FIG. 3, a more detailed block diagrammatic view of variable high power amplifier circuit 30 is illustrated. As in the previous figure, the high power amplifier receives communication signals from receive antenna 20, receiver 22, and gain control 28. High power amplifier 30 also includes a power conditioner 41 and a telemetry and command interface 43 that may be part of spacecraft control processor or controller 40. Telemetry and command interface 43 may also act as a controller in and of itself. Power conditioner 41 includes a DC power input 42 that is used to ultimately control the saturated power of the high power amplifier. Telemetry and command interface 43 has a command input 44, a power level command input 46, and a telemetry output 48.

The system works by generating a power level command from a controller to the telemetry and command interface. The power level command is received from the command antenna 36 that ultimately originates from the ground station 16. The command signal commands the power conditioner 41 to change the saturated output power point of the high power amplifier 30.

As mentioned above, the high power amplifier 30 may be one of several different types of amplifiers. For a traveling wave tube amplifier, the anode voltage is used by the power conditioner for power control. For a solid-state power amplifier the drain voltage of a field effect transistor is used to control the saturated output power.

Each of the high power amplifiers has a minimum isotropic radiated power. The minimum effective isotropic radiated power varies within the rings or groupings of the high power amplifiers. Therefore, the saturated power output of the high power amplifiers within the groups of high power amplifiers may be reduced on an individual basis to reduce the amount of power consumption for the satellite.

Referring now to FIG. 4, a comparison chart illustrating the DC input power backoff in decibels is illustrated using input power backoff versus variable power control of the present invention. The second, third and fourth columns illustrate two different types of traveling wave tubes and a solid-state power amplifier using traditional power backoff. Column 5 illustrates the power reduction using a traveling wave tube amplifier and the savings is illustrated in column 6 showing the amount of power savings using the variable power control system versus input power backoff of the prior art. In columns 7 and 8, the solid-state power amplifier using variable power control is illustrated along with the power savings. As can be seen, a significant amount of power savings may be achieved by variable power control versus input power backoff of the prior art. The savings are multiplied by the number of power amplifiers employed on each satellite. The number may be significant.

Figure 5:
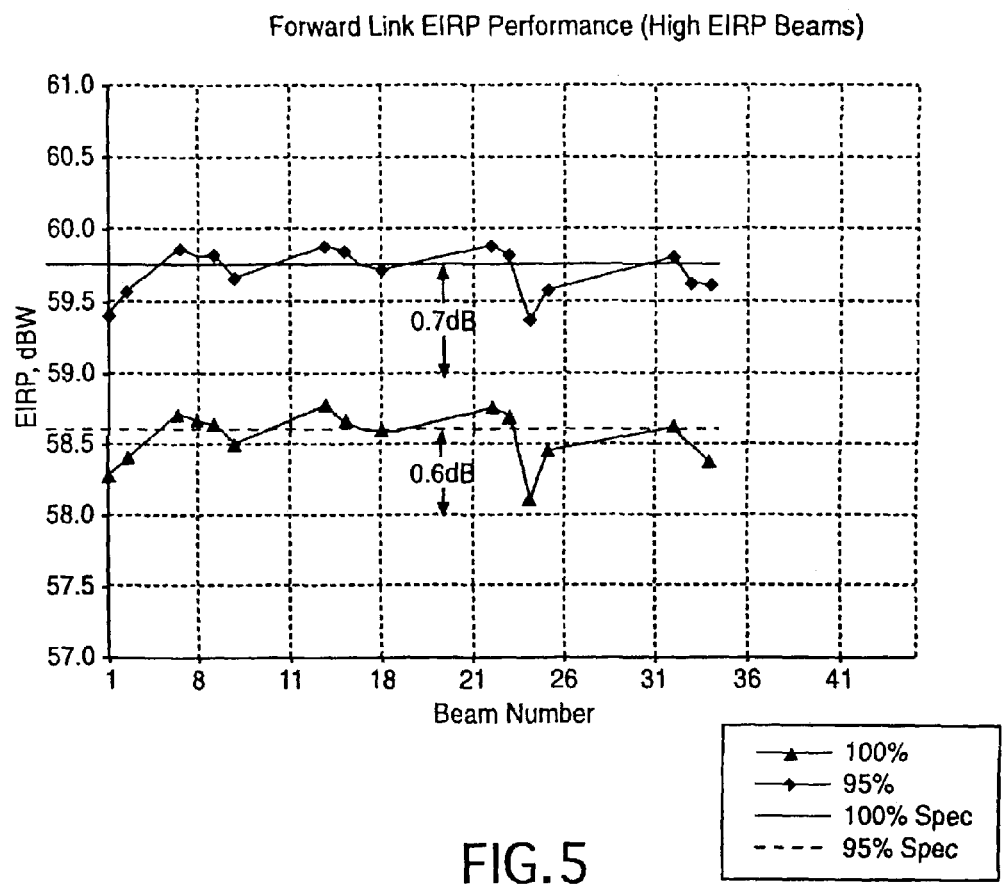
FIG. 5 is a graph illustrating the relationship between effective isotropic radiated power and beam number.

Referring now to FIG. 5, using the Boeing spacecraft described above and using the variable power control described above, the extra effective isotropic radiated power is reduced by 0.6 to 0.7 dB. This corresponds to extra power saved of approximately 6%. When multiplied by the approximately 5.7 kW consumed by all the Ka-Band traveling wave tube amplifiers together, a 342 W savings becomes significant. In FIG. 5, the difference in the corresponding effective isotropic radiation performance is illustrated.

While the invention has been described in connection with one or more embodiments, it should be understood that the invention is not limited to those embodiments. On the contrary, the invention is intended to cover all alternatives, modifications, and equivalents, as may be included within the spirit and scope of the appended claims.

What is claimed is:

1. A power system for a satellite comprising:
   a high power amplifier having a control input and a minimum effective isotropic radiated power, the control input being directly coupled to the high power amplifier; and
   a controller coupled to the control input, said controller generating a control signal to adjust a saturated power output of the high power amplifier to the minimum effective isotropic radiated power of the high power amplifier.

2. A system as recited in claim 1 wherein said high power amplifier comprises a traveling wave tube amplifier.

3. A system as recited in claim 1 wherein said high power amplifier comprises a solid-state power amplifier.

4. A system as recited in claim 1 further comprising a power conditioner coupled to the high power amplifier, said power conditioner adjusting a control voltage for the high power amplifier.

5. A system as recited in claim 1 wherein said high power amplifier comprises a variable power high power amplifier.

6. A satellite system comprising:
   a receiver for receiving command signals;
   a plurality of power conditioners;
   a plurality of variable power high power amplifiers, each of the plurality of the power conditioners being coupled to a corresponding one of the plurality of variable power high power amplifiers, each of the plurality of variable power high power amplifiers having a minimum effective isotropic radiated power;
   a controller receiving command signals and generating control signals in response to the command signals; and
   each of said plurality of power conditioners generating a control voltage in response to the control signals, said control voltage coupled to the corresponding one of said plurality of variable power high power amplifiers, said control voltage selectively reducing the saturated power of the corresponding one of the plurality of variable power high power amplifiers to the minimum effective isotropic radiated power of the corresponding one of the plurality of variable power high power amplifiers.

7. A system as recited in claim 6 wherein said receiver is coupled to a receive antenna.

8. A system as recited in claim 6 further comprising a gain controller coupled to the high power amplifier.

9. A system as recited in claim 6 wherein said plurality of high power amplifiers comprises a plurality of traveling wave tube amplifiers.

10. A system as recited in claim 9 wherein said control voltages are coupled to anodes of said plurality of traveling wave tubes.

11. A system as recited in claim 6 wherein said plurality of high power amplifiers comprises a solid-state power amplifier.

12. A system as recited in claim 11 wherein said control voltages are coupled to drains of field effect transistors of said solid-state amplifiers.

13. A system as recited in claim 6 wherein said controller comprises a spacecraft control processor.

14. A method for operating a satellite comprising:
   providing a plurality of high power amplifiers each having a control input and a minimum effective isotropic radiated power, the control input being directly coupled to each of the plurality of high power amplifiers;
   generating the control input for the plurality of high power amplifiers; and
   adjusting the effective saturated power output of the plurality of high power amplifiers to the minimum effective isotropic radiated power.

15. A method as recited in claim 14 wherein providing a plurality of high power amplifiers comprises providing a variable power high power amplifier.

16. A method as recited in claim 14 further comprising receiving a command signal and generating the control input as a function of the command signal.

17. A method as recited in claim 14 wherein receiving a command signal comprises receiving a command signal from a ground station.

18. A method as recited in claim 14 wherein adjusting comprises controlling a drain voltage of a field effect transistor of the plurality of high power amplifiers.

19. A method as recited in claim 14 wherein adjusting comprises controlling an anode voltage of a traveling wave tube of the plurality of high power amplifiers.

* * * * *